United States Patent
Wada et al.

(10) Patent No.: US 11,518,937 B2
(45) Date of Patent: Dec. 6, 2022

(54) ETCHING SOLUTION AND METHOD FOR MANUFACTURING SEMICONDUCTOR ELEMENT

(71) Applicant: TOKYO OHKA KOGYO CO., LTD., Kawasaki (JP)

(72) Inventors: Yukihisa Wada, Kawasaki (JP); Daijiro Mori, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 0 days.

(21) Appl. No.: 17/127,314

(22) Filed: Dec. 18, 2020

(65) Prior Publication Data

US 2021/0198572 A1 Jul. 1, 2021

(30) Foreign Application Priority Data

Dec. 25, 2019 (JP) .............................. JP2019-233655
Oct. 28, 2020 (JP) .............................. JP2020-180113

(51) Int. Cl.
  *C09K 13/08* (2006.01)
  *H01L 21/306* (2006.01)
  *H01L 29/161* (2006.01)

(52) U.S. Cl.
  CPC ........ *C09K 13/08* (2013.01); *H01L 21/30604* (2013.01); *H01L 29/161* (2013.01)

(58) Field of Classification Search
  None
  See application file for complete search history.

(56) References Cited

U.S. PATENT DOCUMENTS

| | | | | |
|---|---|---|---|---|
| 8,466,071 | B2 * | 6/2013 | Koyata | H01L 21/6708 438/748 |
| 2006/0097362 | A1 * | 5/2006 | Wilmot | H01L 21/78 257/666 |
| 2008/0038932 | A1 * | 2/2008 | Wagner | C09K 13/08 438/753 |
| 2008/0176385 | A1 | 7/2008 | Kato et al. | |
| 2009/0075087 | A1 * | 3/2009 | Xu | B81C 1/00801 428/413 |
| 2009/0078982 | A1 * | 3/2009 | Rachmady | H01L 29/78696 257/315 |
| 2013/0045589 | A1 * | 2/2013 | Kim | H01L 29/6659 438/514 |
| 2013/0171765 | A1 * | 7/2013 | Braun | C09K 13/08 438/73 |
| 2019/0284701 | A1 * | 9/2019 | Kim | C09K 13/06 |
| 2020/0243338 | A1 * | 7/2020 | Lee | H01L 29/167 |

FOREIGN PATENT DOCUMENTS

JP 2008-160073 A 7/2008

* cited by examiner

*Primary Examiner* — Allan W. Olsen
(74) *Attorney, Agent, or Firm* — Knobbe, Martens, Olson & Bear LLP

(57) ABSTRACT

An etching solution for selectively performing an etching process on a compound represented by General Formula $Si_{1-x}Ge_x$, in which x is more than 0 and less than 1, with respect to Si, Ge, and oxides thereof, the etching solution including hydrofluoric acid, nitric acid, and water, in which a content ratio of the hydrofluoric acid in the entire etching solution is 0.002% by mass or more and 1.0% by mass or less, a content ratio of the nitric acid in the entire etching solution is 10% by mass or more, and a content ratio of the water in the entire etching solution is 40% by mass or less.

11 Claims, No Drawings

ETCHING SOLUTION AND METHOD FOR MANUFACTURING SEMICONDUCTOR ELEMENT

BACKGROUND OF THE INVENTION

Field of the Invention

The present invention relates to an etching solution and a method for manufacturing a semiconductor element.

Priority is claimed on Japanese Patent Application No. 2019-233655 filed in Japan on Dec. 25, 2019, and Japanese Patent Application No. 2020-180113 filed in Japan on Oct. 28, 2020, the contents of which are incorporated herein by reference.

Description of Related Art

In the related art, the scaling of configurations in integrated circuits has made it possible to increase the density of functional units on semiconductor chips. For example, reducing transistor size makes it possible to incorporate more memory elements onto a chip, allowing the manufacturing of products with increased capacity.

In the manufacturing of field effect transistors (FETs) for integrated circuit devices, as a semiconductor crystal material other than silicon, Ge is used. In some cases, Ge has various advantageous characteristics in comparison with silicon, such as high charge carrier (hole) mobility, bandgap offset, different lattice constants, and the ability to alloy with silicon to form a semiconductor binary alloy of SiGe.

With respect to Ge materials (in particular, a compound represented by General Formula $Si_{1-x}Ge_x$, in which x is more than 0 and less than 1 and which may be simply referred to below as a "SiGe compound"), various etching solutions with high selection rate have been proposed.

For example, it is known that an etching solution containing hydrofluoric acid (DHF) and nitric acid has a high etching ratio for a SiGe compound with respect to Si, $SiO_2$, and the like (refer to, for example, Japanese Unexamined Patent Publication No. 2008-160073).

On the other hand, with an etching solution containing hydrofluoric acid (DHF) and nitric acid, when selectively etching only SiGe in a laminated structure formed of Si/SiGe/Si for example, there is a problem in that the etching of the SiGe layer stops halfway (a so-called etching stop occurs) when the etching is continued for a long time. For this reason, during SiGe removal, there are problems in that the Si layer is etched unintentionally, it is not possible to obtain a stable shape, variations occur in the transistor characteristics, and, furthermore, the yield is deteriorated.

In order to solve the problem described above, the following method is proposed in Japanese Unexamined Patent Publication No. 2008-160073.

(Method 1)

While rotating a substrate provided with a SiGe layer, a fluorine nitric acid solution is sprayed for a short time of approximately several tens of seconds to etch the SiGe layer. Next, while rotating the substrate, the spraying of the fluorine nitric acid solution is temporarily stopped. Then, while rotating the substrate, a fluorine nitric acid solution formed of a new liquid is sprayed thereon again.

(Method 2)

A substrate provided with a SiGe layer is immersed in a fluorine nitric acid solution stored in an etching tank and the SiGe layer is wet-etched for a short time of approximately one minute. Next, the result is taken out from the etching tank and immersed in a water washing tank to perform a water washing process. After that, the substrate is immersed in the fluorine nitric acid solution stored in the etching tank again and wet-etching is performed for a short time of approximately one minute. The etching process and the water washing process are repeated a plurality of times in this manner.

SUMMARY OF THE INVENTION

However, since the number of steps in the manufacturing process was increased in the method described in Japanese Unexamined Patent Publication No. 2008-160073, there was a problem of being impractical in terms of production efficiency and manufacturing cost.

The present invention was made in view of the above circumstances and has an object of providing an etching solution which is able to selectively perform an etching process on a compound represented by General Formula $Si_{1-x}Ge_x$ with respect to Si, Ge, and oxides thereof, and with which etching stops do not easily occur, and a method for manufacturing a semiconductor using the etching solution.

In order to solve the problems described above, the present invention adopts the following configurations.

A first aspect of the present invention is an etching solution for selectively performing an etching process on a compound represented by General Formula $Si_{1-x}Ge_x$ (here, x is more than 0 and less than 1), with respect to Si, Ge, and oxides thereof, the etching solution including hydrofluoric acid, nitric acid, and water, in which a content ratio of the hydrofluoric acid in the entire etching solution is 0.002% by mass or more and 1.0% by mass or less, a content ratio of the nitric acid in the entire etching solution is 10% by mass or more, and a content ratio of the water in the entire etching solution is 40% by mass or less.

A second aspect of the present invention is a method for manufacturing a semiconductor element, the method including a step of performing an etching process on an object to be processed including a compound represented by General Formula $Si_{1-x}Ge_x$ by using the etching solution.

According to the etching solution of the present invention, it is possible to selectively perform an etching process on a compound represented by General Formula $Si_{1-x}Ge_x$, with respect to Si, Ge, and oxides thereof while suppressing etching stops.

In addition, according to the method for manufacturing a semiconductor of the present invention, it is possible to manufacture a semiconductor in which a compound represented by General Formula $Si_{1-x}Ge_x$ is subjected to a process of selective etching, with respect to Si, Ge, and oxides thereof.

DETAILED DESCRIPTION OF THE INVENTION (Etching Solution)

The etching solution according to the first aspect of the present invention includes hydrofluoric acid, nitric acid, and water. The etching solution according to the present aspect is used in order to selectively perform an etching process on a compound represented by General Formula $Si_{1-x}Ge_x$, (here, x is more than 0 and less than 1) (may be simply referred to below as a "SiGe compound"), with respect to Si, Ge, and oxides thereof.

<Hydrofluoric Acid>

The etching solution according to the present embodiment includes hydrofluoric acid (DHF).

The content ratio of hydrofluoric acid in the entire etching solution is 0.002% by mass or more and 1.0% by mass or less, preferably 0.005% by mass or more and 0.9% by mass or less, more preferably 0.01% by mass or more and 0.8% by mass or less, even more preferably 0.01% by mass or more and 0.7% by mass or less, and yet more preferably 0.02% by mass or more and 0.6% by mass or less.

When the content of hydrofluoric acid is within the above ranges, the etching rate with respect to the SiGe compound is improved.

<Nitric Acid>

The etching solution according to the present embodiment includes nitric acid ($HNO_3$).

The content ratio of nitric acid in the entire etching solution is 10% by mass or more, preferably 10% by mass or more and 55% by mass or less, more preferably 11% by mass or more and 55% by mass or less, even more preferably 12% by mass or more and 54% by mass or less, and yet more preferably 15% by mass or more and 54% by mass or less.

When the content of nitric acid is within the above ranges, the SiGe compound is easily oxidized and the etching rate with respect to the SiGe compound is improved.

<Water>

The etching solution of the present embodiment includes water.

The water may include trace components inevitably mixed therein. The water used in the etching solution of the present embodiment is preferably water subjected to a purification process such as distilled water, ion-exchanged water, or ultrapure water, and it is more preferable to use ultrapure water generally used in semiconductor manufacturing.

The content ratio of water in the entire etching solution is 40% by mass or less, preferably 5% by mass or more and 40% by mass or less, more preferably 6% by mass or more and 38% by mass or less, even more preferably 7% by mass or more and 36% by mass or less, and yet more preferably 8% by mass or more and 35% by mass or less.

When the water content is within the above ranges, it is possible to control the etching rate of SiGe.

<Other Components>

The etching solution of the present embodiment may include other components in addition to the components described above in a range in which the effects of the present invention are not impaired. Examples of other components include solvents, phosphoric acid and/or derivatives thereof, pH adjusters, passivation agents, surfactants, and the like.

Solvent

It is possible to prepare the etching solution of the present embodiment by mixing hydrofluoric acid, nitric acid, water, and other optional components with a solvent.

The solvent is not particularly limited and examples thereof include polar organic solvents and the like.

Polar Organic Solvent

The etching solution of the present embodiment may contain a polar organic solvent in a range in which the effects of the present invention are not impaired. Examples of polar organic solvents include organic carboxylic acid solvents (for example, acetic acid, formic acid, and the like), alcohol-based solvents (for example, methanol, ethanol, ethylene glycol, propylene glycol, glycerin, 1,3-propanediol, 1,3-butanediol, 1,4-butanediol, diethylene glycol, dipropylene glycol, furfuryl alcohol, and 2-methyl-2,4-pentanediol, and the like), dimethyl sulfoxide, ether-based solvents (for example, ethylene glycol dimethyl ether, diethylene glycol dimethyl ether, triethylene glycol dimethyl ether, tetraethylene glycol dimethyl ether, and propylene glycol dimethyl ether), and the like.

Among the above, as the polar organic solvent, an organic carboxylic acid solvent is preferable, and acetic acid is more preferable.

In the etching solution of the present embodiment, one type of polar organic solvent may be used alone, or two or more types may be used in combination.

In a case where the etching solution of the present embodiment includes a polar organic solvent, the content of the polar organic solvent is, for example, 10 to 90% by mass with respect to the total mass of the etching solution, preferably 11 to 85% by mass, and more preferably 12 to 80% by mass.

Phosphoric Acid and/or Derivatives Thereof

The etching solution of the present embodiment may contain phosphoric acid and/or a derivative thereof as a solvent in a range in which the effects of the present invention are not impaired. Examples of phosphoric acid and/or derivatives thereof include compounds represented by General Formula (1).

$$O=P(OR)_3 \quad (1)$$

[In the formula, each R is independently a hydrogen atom or an alkyl group having 1 to 20 carbon atoms.]

In Formula (1), examples of the alkyl group having 1 to 20 carbon atoms in R include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, isomers of the above alkyl groups, and the like.

Among the above, as R, a hydrogen atom or an alkyl group having 1 to 10 carbon atoms is preferable, and a hydrogen atom is more preferable.

In the etching solution of the present embodiment, one type of phosphoric acid and/or a derivative thereof may be used alone, or two or more types may be used in combination.

In a case where the etching solution of the present embodiment includes phosphoric acid and/or a derivative thereof, the content of phosphoric acid and/or a derivative thereof is, for example, 1 to 40% by mass with respect to the total mass of the etching solution, preferably 2 to 38% by mass, more preferably 3 to 37% by mass, and even more preferably 5 to 35% by mass.

pH Adjuster

The etching solution of the present embodiment may include a pH adjuster in order to further improve the etching rate with respect to the SiGe compound.

As the pH adjuster, at least one type selected from the group consisting of acids and salts thereof is preferable. Specifically, examples thereof include methanesulfonic acid, trifluoromethanesulfonic acid, oxalic acid dihydrate, citric acid, tartaric acid, picolinic acid, succinic acid, acetic acid, lactic acid, sulfosuccinic acid, benzoic acid, propionic acid, formic acid, pyruvate, maleic acid, malonic acid, fumaric acid, malic acid, ascorbic acid, mandelic acid, heptanic acid, butyric acid, valeric acid, glutaric acid, phthalic acid, hypophosphoric acid, salicylic acid, 5-sulfosalicylic acid, hydrochloric acid, ethanesulfonic acid, butane sulfonic acid, p-toluene sulfonic acid, dichloroacetic acid, difluoroacetic acid, monochloroacetic acid, monofluoroacetic acid, trichloroacetic acid, trifluoroacetic acid, hydrobromic acid (62% by weight), sulfuric acid, ammonium acetate, sodium acetate, potassium acetate, tetramethylammonium acetate and other tetraalkylammonium acetate, phosphonium acetate, ammonium butyrate, ammonium trifluoroacetate, ammonium carbonate, ammonium chloride, ammonium sulfate, phosphoric acid, diammonium hydrogen phosphate, ammonium dihydrogen phosphate, hydrogen phosphate bis(tetramethylammonium), disodium hydrogen phosphate, sodium dihydrogen phosphate, dipotassium hydrogen phosphate, potassium dihydrogen phosphate, ditetraalkylammonium hydrogen phosphate, ditetraalkylammonium dihydrogen phosphate, diphosphonium hydrogen phosphonium phosphate, phosphonium dihydrogen phosphate, ammonium phosphonate, tetraalkylammonium phosphonate, sodium phosphonate, potassium phosphonate, phosphonium phosphonate, etidronic acid and salts thereof, and the like.

Among the above, ammonium acetate or ammonium sulfate is preferable.

In addition, the etching solution of the present embodiment may include a basic compound as a pH adjuster. It is possible to use organic alkaline compounds and inorganic alkaline compounds as such basic compounds and suitable examples of the organic alkaline compound include quaternary ammonium salts including organic quaternary ammonium hydroxides, salts of alkylamines such as trimethylamine and triethylamine and derivatives thereof.

In addition, examples of inorganic alkaline compounds include inorganic compounds including alkali metals or alkaline earth metals and salts thereof. Examples thereof include lithium hydroxide, sodium hydroxide, potassium hydroxide, rubidium hydroxide, cesium hydroxide, and the like.

In the etching solution of the present embodiment, one type of pH adjuster may be used alone, or two or more types may be used in combination.

In a case where the etching solution of the present embodiment includes a pH adjuster, the content of the pH adjuster is, for example, 0.01 to 10% by mass with respect to the total mass of the etching solution, preferably 0.02 to 4.5% by mass, more preferably 0.03 to 4% by mass, and even more preferably 0.05 to 3% by mass. When the content of the pH adjuster is within the above ranges, the etching rate for the SiGe compound is easily improved further.

Passivation Agent

The etching solution of the present embodiment may include a passivation agent for germanium.

Examples of passivation agents include ascorbic acid, L (+)-ascorbic acid, isoascorbic acid, ascorbic acid derivatives, boric acid, ammonium diborate, borate (for example, ammonium pentaborate, sodium tetraborate, and ammonium diborate), alanine, arginine, ascoragine, aspartic acid, cysteine, glutamate, glutamine, histidine, isoleucine, leucine, lysine, methionine, phenylalanine, proline, serine, threonine, tryptophan, tyrosine, valine, sodium bromide, potassium bromide, rubidium bromide, magnesium bromide, calcium bromide, ammonium bromide having the formula $NR^1R^2R^3R^4Br$ (in the formula, $R^1$, $R^2$, $R^3$ and $R^4$ may be the same or different from each other and are selected from the group consisting of hydrogen and branched or straight chain alkyls having 1 to 6 carbon atoms (for example, methyl, ethyl, propyl, butyl, pentyl, or hexyl)), or the like.

In the etching solution of the present embodiment, one type of passivation agent may be used alone, or two or more types may be used in combination.

In a case where the etching solution of the present embodiment includes a passivation agent, for example, 0.01 to 5% by mass with respect to the total mass of the etching solution is preferable, and 0.1 to 1% by mass is more preferable.

Surfactant

The etching solution of the present embodiment may include a surfactant for the purpose of adjusting the wettability of the etching solution with respect to the object to be processed, or the like. As the surfactant, it is possible to use a nonionic surfactant, an anionic surfactant, a cationic surfactant, or an amphoteric surfactant, and these may be used in combination.

Examples of nonionic surfactants include polyalkylene oxide alkylphenyl ether surfactants, polyalkylene oxide alkyl ether surfactants, block polymer surfactants formed of polyethylene oxide and polypropylene oxide, polyoxyalkylene distyrenated phenyl ether surfactants, polyalkylene tribenzylphenyl ether surfactants, acetylene polyalkylene oxide surfactants, and the like.

Examples of anionic surfactants include alkyl sulfonic acid, alkyl benzene sulfonic acid, alkyl naphthalene sulfonic acid, alkyl diphenyl ether sulfonic acid, fatty acid amide sulfonic acid, polyoxyethylene alkyl ether carboxylic acid, polyoxyethylene alkyl ether acetic acid, polyoxyethylene alkyl ether propionic acid, alkyl phosphonic acid, fatty acid salts, and the like. Examples of "salts" include ammonium salt, sodium salt, potassium salt, tetramethylammonium salt, and the like.

Examples of cationic surfactants include a quaternary ammonium salt surfactant, an alkyl pyridium surfactant, and the like.

Examples of amphoteric surfactants include betaine surfactants, amino acid surfactants, imidazoline surfactants, amine oxide surfactants, and the like.

These surfactants are generally commercially available. One type of surfactant may be used alone. Two or more types may be used in combination.

<Object to be Processed>

The etching solution of the present embodiment is used for SiGe compound etching and an object to be processed including a SiGe compound is the object of the etching process. The object to be processed is not particularly limited as long as the object includes a SiGe compound and examples thereof include a substrate having a SiGe compound-containing layer (SiGe compound-containing film) or the like. The substrate is not particularly limited and examples thereof include various substrates such as a semiconductor wafer, a glass substrate for a photomask, a glass substrate for a liquid crystal display, a glass substrate for a plasma display, a substrate for a Field Emission Display (FED), a substrate for an optical disc, a substrate for a magnetic disk, and substrate for a magneto-optical disc. As the substrate, a substrate used for semiconductor device production is preferable. In addition to the SiGe compound-containing layer and the base material of the substrate, the substrate may have various layers and structures as appropriate, such as, for example, metal wiring, a gate structure, a source structure, a drain structure, an insulating layer, a ferromagnetic layer, and a non-magnetic layer. In addition, the uppermost layer on the device surface of the substrate does not need to be the SiGe compound-containing layer and, for example, an intermediate layer of a multilayer structure may be the SiGe compound-containing layer.

The size, thickness, shape, layer structure, and the like of the substrate are not particularly limited and appropriate selection according to the purpose is possible.

The SiGe compound-containing layer is preferably a layer containing a SiGe compound, and more preferably a SiGe compound film. The thickness of the SiGe compound-containing layer on the substrate is not particularly limited and appropriate selection according to the purpose is possible. Examples of the thickness of the SiGe compound-containing layer include a range of 1 to 200 nm and 1 to 20 nm.

In addition to the SiGe compound, the object to be processed may include at least one type selected from the group consisting of Si, Ge, and oxides thereof, and preferably includes $SiO_2$.

The etching solution of the present embodiment may be used for performing fine processing of the SiGe compound-containing layer in the substrate, may be used for removing SiGe compound-containing deposits attached to the substrate, and may be used to remove impurities such as particles from the object to be processed having the SiGe compound-containing layer on the surface.

According to the etching solution of the present embodiment described above, since hydrofluoric acid, nitric acid, and water are included in specific amounts, it is possible to selectively perform an etching process on the compound (SiGe compound) represented by General Formula $Si_{1-x}Ge_x$ with respect to Si, Ge, and oxides thereof and to suppress SiGe compound etching stops. The reason why is not clear, but is presumed to be as follows. When the etching solution of the present embodiment is brought into contact with the object to be processed including the SiGe compound, the SiGe compound is oxidized by nitric acid. The oxide of the SiGe compound is etched by fluoride ions (F—) in hydrofluoric acid. Specifically, SiGe is removed by the electrochemical reaction of Formula (1).

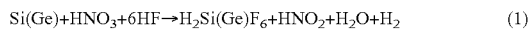

$$Si(Ge)+HNO_3+6HF \rightarrow H_2Si(Ge)F_6+HNO_2+H_2O+H_2 \quad (1)$$

As shown in Formula (1), when a SiGe compound is etched for a long time using an etching solution containing hydrofluoric acid and nitric acid, the oxidation rate of Ge by nitric acid and nitrite is faster than that of Si, thus, there is a concern in that the Ge concentration on the outermost surface of the SiGe layer may be lowered during etching and the etching of the SiGe layer may be stopped halfway, that is, etching stops may occur.

However, it is presumed that, since the etching solution of the present embodiment is formed with the contents of hydrofluoric acid, nitric acid, and water within specific ranges, the oxidation rates of Si and Ge are equal, and it is possible to selectively etch the SiGe compound while SiGe compound etching stops are suppressed.

(Method for Manufacturing Semiconductor Element)

The method for manufacturing a semiconductor element according to the second aspect of the present invention includes a step of performing an etching process on an object to be processed including a SiGe compound by using the etching solution according to the first aspect.

Examples of the object to be processed including a SiGe compound include the same examples as those described in "<Object to be Processed>" in the "(Etching Solution)" described above and preferable examples include a substrate having a SiGe compound-containing layer. The method for forming the SiGe compound-containing layer on the substrate is not particularly limited and it is possible to use known methods. Examples of such methods include a sputtering method, a chemical vapor deposition (CVD) method, an epitaxial growth (EG) method, an atomic layer deposition (ALD) method, and the like. The raw material of the SiGe compound-containing layer used when forming the SiGe compound-containing layer on the substrate is not particularly limited and appropriate selection thereof is possible according to the film forming method. In addition to the SiGe compound, the object to be processed may include at least one type selected from the group consisting of Si, Ge, and oxides thereof, and preferably includes $SiO_2$.

<Step of Carrying Out Process of Etching Object to be Processed>

This step is a step of performing an etching process on the object to be processed including a SiGe compound, using the etching solution according to the first aspect, and includes an operation of bringing the etching solution into contact with the object to be processed. The etching process method is not particularly limited and it is possible to use a known etching method. Examples of such methods include a spray method, an immersion method, a liquid filling method, or the like, without being limited thereto.

In the spray method, for example, the object to be processed is transported or rotated in a predetermined direction, the etching solution according to the first aspect is sprayed into the space such that the etching solution is brought into contact with the object to be processed. As necessary, the etching solution may be sprayed while rotating the substrate using a spin coater.

In the immersion method, the object to be processed is immersed in the etching solution according to the first aspect and the etching solution is brought into contact with the object to be processed.

In the liquid filling method, the etching solution according to the first aspect is filled in the object to be processed and the object to be processed and the etching solution are brought into contact with each other.

It is possible to appropriately select these etching process methods depending on the structure, materials, and the like of the object to be processed. In a case of the spray method or the liquid filling method, it is sufficient if the amount of the etching solution supplied to the object to be processed is an amount by which the surface to be processed in the object to be processed is sufficiently wetted by the etching solution.

The purpose of the etching process is not particularly limited and may be fine processing for a surface to be processed of the object to be processed including a SiGe compound (for example, a SiGe compound-containing layer on a substrate), may be removal of a SiGe compound-containing deposit attached to the object to be processed (for example, a substrate having a SiGe compound-containing layer), or may be cleaning of a surface to be processed of the object to be processed including a SiGe compound (for example, a SiGe compound-containing layer on the substrate).

The temperature at which the etching process is performed is not particularly limited as long as the temperature is a temperature at which the SiGe compound dissolves in the etching solution. Examples of the temperature for the etching process include 15° C. to 60° C. In a case of any of the spray method, the immersion method, and the liquid filling method, the etching rate is increased by increasing the temperature of the etching solution, but it is possible to appropriately select the processing temperature in consideration of suppressing composition changes in the etching solution to be small, or workability, safety, cost, and the like.

The time for performing the etching process may be appropriately selected according to the purpose of the etching process, the amount of the SiGe compound to be removed by the etching (for example, the thickness of the SiGe compound-containing layer, the amount of SiGe compound deposits, and the like), and the etching process conditions.

<Other Steps>

The method for manufacturing the semiconductor element of the present embodiment may include other steps in addition to the etching process step described above. The other steps are not particularly limited and examples thereof include known steps performed when manufacturing a semiconductor element. Examples of such steps include a step of forming each structure such as channel formation, High-K/metal gate formation, a metal wiring, a gate structure, a source structure, a drain structure, an insulating layer, a ferromagnetic layer, and a non-magnetic layer (layer formation, etching other than the etching process described above, chemical mechanical polishing, modification, and the like), a resist film formation step, an exposure step, a development step, a heating process step, a cleaning step, an inspection step, and the like, without being limited thereto. It is possible to appropriately perform these other steps before or after the etching process step as necessary.

According to the method for manufacturing a semiconductor element of the present embodiment described above, a process of etching an object to be processed is performed using the etching solution according to the first aspect described above, which includes specific amounts of hydrofluoric acid, nitric acid, and water. With the etching solution, it is possible to selectively perform an etching process on the compound represented by General Formula $Si_{1-x}Ge_x$ (SiGe compound) with respect to Si, Ge, and oxides thereof, and to suppress the SiGe compound etching stops. Therefore, according to the method for manufacturing a semiconductor element of the present embodiment, it is possible to obtain a semiconductor element in which a SiGe compound is selectively etched without substantially affecting the Si, Ge, and oxides thereof. In addition, according to the method for manufacturing a semiconductor element of the present embodiment, since SiGe compound etching stops are suppressed, it is possible to carry out the process of selectively etching the SiGe compound for a longer time (for example, 3 minutes or more) than in the related art. Therefore, the method for manufacturing a semiconductor element of the present embodiment does not require a complicated etching step, and not only improves in-plane etching uniformity, but also shortens the processing time, lowering costs and making the practicality high.

EXAMPLES

A more detailed description will be given below of the present invention with reference to Examples, but the present invention is not limited to these Examples.

<Preparation of Etching Solution (1)>

Examples 1 to 6, Comparative Examples 1 to 6

Each component shown in Table 1 was mixed to prepare an etching solution for each Example.

TABLE 1

|  | DHF (% by mass) | HNO₃ (% by mass) | AcOH (% by mass) | DIW (% by mass) |
|---|---|---|---|---|
| Comparative Example 1 | 0.1 | 10 | 40 | 49.9 |
| Example 1 | 0.1 | 10 | 80 | 9.9 |
| Comparative Example 2 | 0.1 | 15 | 30 | 54.9 |
| Comparative Example 3 | 0.1 | 15 | 40 | 44.9 |
| Example 2 | 0.1 | 15 | 50 | 34.9 |
| Comparative Example 4 | 0.1 | 20 | 35 | 44.9 |
| Example 3 | 0.1 | 20 | 40 | 39.9 |
| Example 4 | 0.1 | 20 | 50 | 29.9 |
| Comparative Example 5 | 0.1 | 30 | 0 | 69.9 |
| Comparative Example 6 | 0.1 | 30 | 20 | 49.9 |
| Example 5 | 0.1 | 30 | 30 | 39.9 |
| Example 6 | 0.1 | 40 | 20 | 39.9 |

In Table 1, each abbreviation has the following meaning.
DHF: Hydrofluoric acid
HNO₃: Nitric acid
AcOH: Acetic acid
DIW: Water <Process of Etching Object to be Processed (1)>

A SiGe film was epitaxially grown on a silicon substrate to obtain an object to be processed (1) on which a SiGe film was formed. A test piece was cut out from the obtained object to be processed (1), and, when the film thickness of the SiGe film was measured by fluorescent X-ray analysis, the film thickness was 50 nm.

The etching solution of each Example was placed in a beaker and the test piece was immersed in the etching solution of each Example for 5 minutes at room temperature (23° C.) to perform the etching process. After the etching process, the test piece was dried by blowing nitrogen and the film thickness of the SiGe film was measured by fluorescent X-ray analysis. The etching rate (nm/min) with respect to SiGe was calculated from the film thickness of the SiGe film before and after the etching process. The results are shown in Table 2.

<Process of Etching Object to be Processed (2)>

A silicon oxide film was formed on a silicon substrate by thermal oxidation to obtain an object to be processed (2). A test piece was cut out from the obtained object to be processed (2), and, when the film thickness of the silicon oxide film was measured by spectroscopic ellipsometry, the film thickness was 100 nm.

The etching solution of each Example was placed in a beaker and the test piece was immersed in the etching solution of each Example for 5 minutes at room temperature (23° C.) to perform the etching process. After the etching process, the test piece was dried by blowing nitrogen and the film thickness of the silicon oxide film was measured by spectroscopic ellipsometry. The etching rate (nm/min) with respect to silicon oxide was calculated from the film thickness of the silicon oxide film before and after the etching process. The results are shown in Table 2.

<Process of Etching Object to be Processed (3)>

A test piece was cut out from the SOI (100) substrate to obtain an object to be processed (3). When the film thickness of the Si film of the obtained object to be processed (3) was measured by spectroscopic ellipsometry, the film thickness was 100 nm.

The etching solution of each Example was placed in a beaker and the test piece was immersed in the etching solution of each Example for 5 minutes at room temperature (23° C.) to perform the etching process. After the etching process, the test piece was dried by blowing nitrogen and the film thickness of the Si film was measured by spectroscopic ellipsometry. The etching rate (nm/min) with respect to Si was calculated from the film thickness of the Si film before and after the etching process. The results are shown in Table 2.

<Evaluation of Etching Selection Rate (1)>

Based on the results of the etching rate obtained in the "Process of Etching Object to be Processed (1)", "Process of Etching Object to be Processed (2)" and "Process of Etching Object to be Processed (3)", the etching selection rate of the object to be processed (1)/the object to be processed (2) and the etching selection rate of the object to be processed (1)/the object to be processed (3) were calculated. The results are shown in Table 2.

<Etching Stop Evaluation (1)>

According to the SiGe etching rate (nm/min) obtained in the "Process of Etching Object to be Processed (1)" described above, the etching rate (nm/min) with respect to SiGe when the etching process time was changed as described below was calculated and evaluated using the following criteria.

A Case where the SiGe Etching Rate was 10 nm/min or Less

A comparison was carried out when the etching process time was 1 minute, 3 minutes, and 5 minutes and evaluated according to the following evaluation criteria.

A: The rate of change in the etching rate (nm/min) with respect to SiGe after the etching process for 1 minute from the etching rate with respect to SiGe after the etching process for 5 minutes is within 20%.

B: The rate of change in the etching rate (nm/min) with respect to SiGe after the etching process for 1 minute from the etching rate with respect to SiGe after the etching process for 5 minutes exceeds 20%.

C: The etching rate with respect to SiGe after the etching process for 5 minutes is 0.6 nm/min or less.

The SiGe Etching Rate is More than 10 nm/Min and 20 nm/min or Less

A comparison was carried out when the etching process time was 30 seconds, 90 seconds, and 150 seconds and evaluated according to the following evaluation criteria.

A: The rate of change in the etching rate (nm/min) with respect to SiGe after the etching process for 30 seconds from the etching rate with respect to SiGe after the etching process for 150 seconds is within 20%.

B: The rate of change in the etching rate (nm/min) with respect to SiGe after the etching process for 30 seconds from the etching rate with respect to SiGe after the etching process for 150 seconds exceeds 20%.

C: The etching rate with respect to SiGe after the etching process for 5 minutes is 0.6 nm/min or less.

The SiGe Etching Rate is More than 20 nm/min and 50 nm/min or Less

A comparison was carried out when the etching process time was 20 seconds, 40 seconds, and 60 seconds and evaluated according to the following evaluation criteria.

A: The rate of change in the etching rate (nm/min) with respect to SiGe after the etching process for 20 seconds from the etching rate with respect to SiGe after the etching process for 60 seconds is within 20%.

B: The rate of change in the etching rate (nm/min) with respect to SiGe after the etching process for 20 seconds from the etching rate with respect to SiGe after the etching process for 60 seconds exceeds 20%.

C: The etching rate with respect to SiGe after the etching process for 5 minutes is 0.6 nm/min or less.

TABLE 2

| | | Etching rate (nm/min) | | | Etching selection rate | |
| | | | | | Object to be processed (1)/ | Object to be processed (1)/ |
| | Etching stop | Object to be processed (1) | Object to be processed (2) | Object to be processed (3) | Object to be processed (2) | Object to be processed (3) |
|---|---|---|---|---|---|---|
| Comparative Example 1 | C | 0.2 | — | — | — | — |
| Example 1 | A | 1.2 | 0.1 | 0.3 | 12.0 | 4.3 |
| Comparative Example 2 | C | 0.2 | — | — | — | — |
| Comparative Example 3 | B | 1.2 | 0.1 | 0.4 | 17.1 | 3.2 |
| Example 2 | A | 2.5 | 0.1 | 0.4 | 35.7 | 6.6 |
| Comparative Example 4 | B | 1.6 | 0.1 | 0.4 | 22.9 | 4.2 |
| Example 3 | A | 2.5 | 0.1 | 0.4 | 35.7 | 6.6 |
| Example 4 | A | 9.6 | 0.1 | 0.4 | 125.2 | 26.4 |
| Comparative Example 5 | C | 0.1 | — | — | — | — |
| Comparative Example 6 | C | 0.5 | — | — | — | — |
| Example 5 | A | 9.7 | 0.1 | 0.4 | 193.4 | 23.0 |
| Example 6 | A | 44.4 | 0.3 | 1.5 | 158.6 | 29.6 |

From the results shown in Table 2, it was confirmed that the etching solutions of Examples 1 to 6 had a higher SiGe etching selection rate as compared with the etching solutions of Comparative Examples 1 to 6 and that the SiGe etching stops were suppressed.

(Examples 7 to 10)

Each component shown in Table 3 was mixed to prepare an etching solution for each example.

TABLE 3

| | DHF (% by mass) | $HNO_3$ (% by mass) | AcOH (% by mass) | $H_3PO_4$ (% by mass) | DIW (% by mass) |
|---|---|---|---|---|---|
| Example 7 | 0.1 | 10 | 40 | 20 | 29.9 |
| Example 8 | 0.1 | 20 | 35 | 10 | 34.9 |

TABLE 3-continued

|  | DHF (% by mass) | HNO₃ (% by mass) | AcOH (% by mass) | H₃PO₄ (% by mass) | DIW (% by mass) |
|---|---|---|---|---|---|
| Example 9 | 0.1 | 30 | 30 | 10 | 29.9 |
| Example 10 | 0.1 | 30 | 40 | 10 | 19.9 |

In Table 3, each abbreviation has the following meaning.
DHF: Hydrofluoric acid
HNO₃: Nitric acid
AcOH: Acetic acid
H₃PO₄: Phosphoric acid
DIW: Water <Process of Etching Object to be Processed (4)>

The etching rate (nm/min) with respect to SiGe was calculated in the same manner as in the above "<Process of Etching Object to be Processed (1)>" except that the etching solutions of Examples 7 to 10 were used. The results are shown in Table 4.

<Process of Etching Object to be Processed (5)>

The etching rate (nm/min) with respect to silicon oxide was calculated in the same manner as in the above "<Process of Etching Object to be Processed (2)>" except that the etching solutions of Examples 7 to 10 were used. The results are shown in Table 4.

<Process of Etching Object to be Processed (6)>

The etching rate (nm/min) with respect to Si was calculated in the same manner as in the above "<Process of Etching Object to be Processed (3)>" except that the etching solutions of Examples 7 to 10 were used. The results are shown in Table 4.

<Evaluation of Etching Selection Rate (2)>

Based on the results of the etching rate obtained in the "Process of Etching Object to be Processed (4)", "Process of Etching Object to be Processed (5)" and "Process of Etching Object to be Processed (6)", the etching selection rate of the object to be processed (4)/the object to be processed (5) and the etching selection rate of the object to be processed (4)/the object to be processed (6) were calculated. The results are shown in Table 4.

<Etching Stop Evaluation (2)>

In the "Process of Etching Object to be Processed (4)" described above, according to the obtained SiGe etching rate (nm/min), the etching rate (nm/min) with respect to SiGe when the etching process time was changed in the same manner as "<Etching Stop Evaluation (1)>" described above was calculated and evaluated according to the same criteria as the "<Etching Stop Evaluation (1)>" described above. The results are shown in Table 4.

From the results shown in Table 4, it was confirmed that the etching solutions of Examples 7 to 10 had a high SiGe etching selection rate and that the SiGe etching stops were suppressed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An etching solution for performing an etching process on a compound represented by General Formula $Si_{1-x}Ge_x$, wherein x is more than 0 and less than 1, the etching solution comprising:
   hydrofluoric acid;
   nitric acid;
   acetic acid; and
   water,
   wherein a content ratio of the hydrofluoric acid in the entire etching solution is 0.02% by mass or more and 0.6% by mass or less,
   a content ratio of the nitric acid in the entire etching solution is 10% by mass or more and 40% by mass or less, and
   a content ratio of the water in the entire etching solution is 40% by mass or less, and
   a content ratio of the acetic acid in the entire etching solution is 20% by mass or more and 80% by mass or less.

2. The etching solution according to claim 1, wherein the content ratio of the nitric acid in the entire etching solution is 15% by mass or more.

3. The etching solution according to claim 1, wherein the content ratio of the water in the entire etching solution is 5% by mass or more.

4. The etching solution according to claim 1, further comprising phosphoric acid and/or a derivative thereof.

5. The etching solution according to claim 1, wherein the content ratio of the hydrofluoric acid in the entire etching solution is 0.1% by mass or less.

6. The etching solution according to claim 1,
   wherein the content ratio of the nitric acid in the entire etching solution is 15% by mass or less and 40% by mass or less, and

TABLE 4

|  |  | Etching rate (nm/min) | | | Etching selection rate | |
|---|---|---|---|---|---|---|
|  | Etching stop | Object to be processed (4) | Object to be processed (5) | Object to be processed (6) | Object to be processed (4)/ processed (5) | Object to be processed (4)/ processed (6) |
| Example 7 | A | 3.1 | 0.0 | 0.7 | 77.3 | 4.4 |
| Example 8 | A | 4.2 | 0.3 | 1.0 | 13.1 | 4.2 |
| Example 9 | A | 16.2 | 0.3 | 0.8 | 64.6 | 21.5 |
| Example 10 | A | 22.3 | 0.1 | 1.0 | 159.6 | 23.4 | the content ratio of the acetic acid in the entire etching solution is 20% by mass or less and 50% by mass or less.

7. The etching solution according to claim 1, wherein the content ratio of the water in the entire etching solution is 9.9% by mass or more.

8. A method for manufacturing a semiconductor element, the method comprising performing an etching process on an object to be processed including a compound represented by General Formula $Si_{1-x}Ge_x$ using the etching solution according to claim 1.

9. The method for manufacturing a semiconductor element according to claim 8, wherein the content ratio of the nitric acid in the entire etching solution is 15% by mass or more.

10. The method for manufacturing a semiconductor element according to claim 8, wherein the content ratio of the water in the entire etching solution is 5% by mass or more.

11. The method for manufacturing a semiconductor element according to claim 8, wherein the etching solution further comprises phosphoric acid and/or a derivative thereof.

* * * * *